United States Patent [19]
Wilkinson

[11] Patent Number: 5,042,423
[45] Date of Patent: Aug. 27, 1991

[54] SEMICONDUCTOR WAFER CARRIER DESIGN

[75] Inventor: Thomas F. Wilkinson, Garland, Tex.

[73] Assignee: Texas Instruments Incorporated, Dallas, Tex.

[21] Appl. No.: 287,753

[22] Filed: Dec. 20, 1988

[51] Int. Cl.$^5$ .............................................. B05C 1/02
[52] U.S. Cl. ................................................... 118/500
[58] Field of Search ......................................... 118/500

[56] References Cited

U.S. PATENT DOCUMENTS

| | | | |
|---|---|---|---|
| 3,623,712 | 11/1971 | McNeilly et al. | 263/41 |
| 4,047,496 | 9/1977 | McNeilly et al. | 118/49.1 |
| 4,048,955 | 9/1977 | Anderson | 118/49.5 |
| 4,081,313 | 11/1976 | McNeilly et al. | 156/610 |
| 4,282,924 | 8/1981 | Fareta | 269/903 |
| 4,323,031 | 4/1982 | Kaplan | 118/500 |
| 4,395,820 | 8/1983 | Sams | 269/903 |
| 4,473,455 | 9/1984 | Dean et al. | 269/903 |
| 4,528,747 | 7/1985 | Hoffman et al. | 269/287 |
| 4,534,314 | 8/1985 | Ackley | 118/500 |
| 4,589,369 | 5/1986 | Mahler | 118/500 |
| 4,595,481 | 6/1986 | Allen et al. | 118/500 |
| 4,634,512 | 1/1987 | Allen et al. | 118/500 |
| 4,650,064 | 3/1987 | Sladaugh | 118/500 |
| 4,693,201 | 6/1978 | Dietze et al. | 118/500 |
| 4,759,488 | 7/1988 | Robinson et al. | 269/903 |
| 4,767,984 | 8/1988 | Bakker | 269/903 |

Primary Examiner—Willard Hoag
Attorney, Agent, or Firm—B. Peter Barndt; James T. Comfort; Melvin Sharp

[57] ABSTRACT

A carrier for use in a continuous chemical vapor deposition reactor system has a lid with tapered edges which match the sides of a recess in the carrier in which the lid resides during processing of the semiconductor to provide a precise fit for the lid and to minimize thermal stresses in the carrier, the lid and the lid-carrier assembly due to extreme heat during processing of the semiconductor wafer.

14 Claims, 3 Drawing Sheets

SEMICONDUCTOR WAFER CARRIER DESIGN

FIELD OF THE INVENTION

This invention relates to semiconductor wafer carriers and more particularly to carriers and carrier lid configurations for use in continuous chemical vapor deposition reactors.

BACKGROUND OF THE INVENTION

A continuous chemical deposition reactor may be a stand-alone process system with a continuous semiconductor wafer flow. Basic subsystems in such a system may include a wafer handling, a reaction chamber, a gas flow system, a cooling system, and an electrical system The wafer handling system may include wafer loaders and unloaders, wafer carriers, and a track for moving a wafer through the reactor chambers.

The reactor chamber subsystem is the site for processing the semiconductor wafer. Each chamber may include a gas supply inlet, a chamber housing, heat lamps and exhaust.

The gas flow subsystem supplies the reactant gases to each chamber, and may include valves, flow controllers and an exhaust system.

The cooling subsystem assists in maintaining the process temperature and reduces the heat radiation to the surrounding components. Both air flow and water flow may be used in the cooling subsystem.

The electrical subsystem provides subsystem control and powers the reactor, and may include power supplies, motors, sensors, valves, and one or more computer/controller.

A basic reactor and process may be as follows. A semiconductor wafer is loaded onto a carrier which enters one end of the reactor through a port and is moved successively through the various chambers and out the other end of the reactor through another port. The reactor may not be physically closed, but has gas seals at each end and in between each chamber of the reactor. As an example, a reactor may include eight chambers in which the first chamber consists of a nitrogen seal, the second chamber is a preheat chamber, the next four chambers may be deposition chambers, then a cool-down chamber, and the last chamber is a nitrogen seal.

A typical gas supply system may supply gases for two different deposition processes which may be directed into any of the deposition chambers. Each chamber is effectively divided into two portions, a top portion and a bottom portion by the wafer carriers and spacers between each wafer carrier. The junctions between the chambers effectively isolate one chamber from the other by the flow of gases or the exhaust gases from the chambers.

SUMMARY OF THE INVENTION

The invention relates to wafer carriers and carrier lid configurations used in multi-chamber continuous chemical vapor deposition reactors. A semiconductor wafer is removed from a wafer cassette by a robotic arm and is placed in a carrier. The carrier may be one of several configurations to accommodate wafers of different diameters. Each carrier may be of a high temperature material, for example, graphite or graphite coated with silicon carbide, and may hold one or more wafers, depending upon the diameter of the wafer. The wafer is placed so that it is face down in the reactor such that all processing of the wafer is done from the underside of the carrier, and a lid is placed over the up-side of the semiconductor wafer to prevent process or other gases from reacting that side, and to provide a uniform heat distribution to the semiconductor during processing.

As hereinafter used, "high temperature material" means graphite or graphite coated with silica carbide.

The carrier lid serves as the susceptor or heat transfer media to deliver heat to the wafer during processing. In processing through a CCVD (continuous chemical vapor deposition) reactor. A semiconductor wafer is placed in a carrier and is moved successively through the various chambers and out the end of the reactor. The semiconductor wafer is placed inverted in the carrier so that the process surface of the semiconductor wafer is face down in the carrier, exposed to process gases through an opening in the under side of the carrier, and the carrier lid covers the up-side or back side of the semiconductor and serves as the susceptor for radiant heat from incandescent lamp heaters.

Each chamber has an associated heat lamp, gas inlets and outlets, a track on which the wafer carrier is moved, there being round grooves on two sides of the carrier that side on the tracks, and seals to prevent the gas from escaping to the environment out side the reactor, and to prevent exhaust gases from entering the process chambers, or reaction gases from entering the topside of the reactor chamber. The carrier is also used to block the movement of process gas to the reactor chamber area above the carrier.

Each chamber of the reactor is divided into two regions by the wafer carrier. These two regions are regions above the carrier and below the carrier. The process gas flows through the lower part of the reactor below the carrier and across the exposed semiconductor wafer face.

An inert gas may be directed through the upper region of the reactor to prevent the process gases from entering the upper region and to help provide the gas pressure differential needed to prevent exhaust gases from entering the process region of the reactor.

The junction between chambers effectively isolates one chamber from the other by the flow process gases or the exhaust of gas or gases from the chambers.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTIONS OF THE DRAWINGS

DESCRIPTION OF A PREFERRED EMBODIMENT OF THE INVENTION

Figure 1:
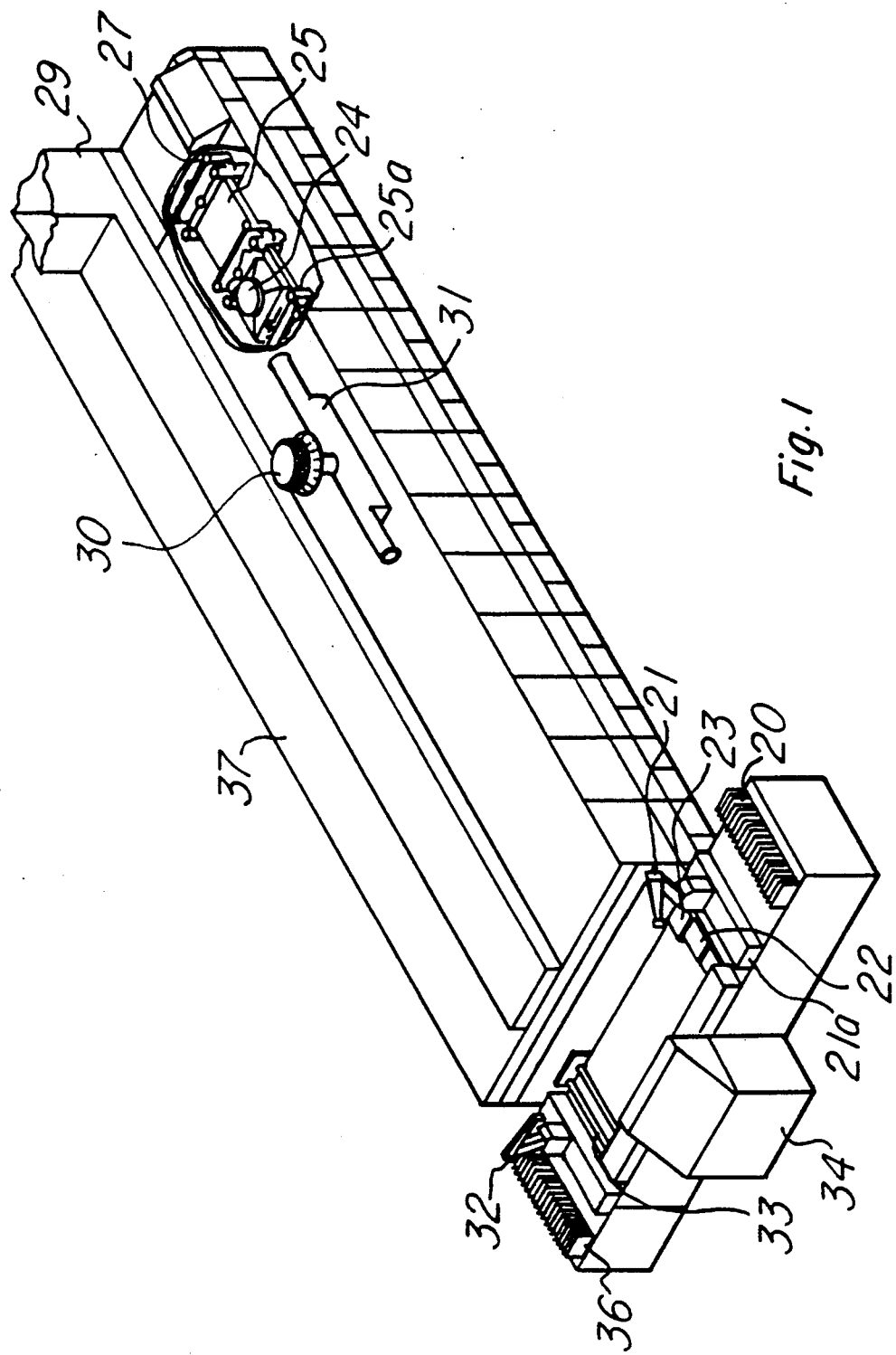
FIG. 1 illustrates a typical CCVD reactor in which the present invention may be used.

FIG. 1 illustrates a typical reactor utilizing the present invention. A plurality of wafer cassettes 20 are located along and adjacent to a robotic arm 21 which moves along a track 21a. The track allows the robotic arm 21 to move adjacent each of a plurality of wafer cassettes so as to permit the robotic arm to access each wafer in each cassette. The robotic arm lifts a wafer from a cassette and places it in a carrier 22 at the entrance to the reactor. The entrance 23 to the reactor is a seal joint to prevent gases in the reactor from exiting from the reactor.

At the entrance 23, and before the carrier enters the reactor a vacuum pick-up arm (not illustrated) lifts the lid from the carrier to allow the robotic arm to place a semiconductor wafer into the carrier. After the semiconductor is placed into the carrier the carrier lid is replace and the carrier is indexed through the reactor and the plurality of chambers that make up the reactor.

The carrier is indexed through the reactor and chambers using the length of the carrier and at least one spacer bar between each carrier. As each carrier is indexed into the reactor, each preceding carrier is moved to the next reactor chamber. The indexing is continuous, and as the carrier exits from the last reaction chamber is moves indexed through the return path of the reactor to the exit opening in the reactor, where the lid of the carrier is removed by the return lid pickup (not illustrated). Tracks 33, which extend through out the reactor, are used to move the wafer carrier through the reactor. A robotic arm 32 mounded on track 32a removes the semiconductor wafer from the carrier and places it in a wafer cassette 36.

The reactor is divided into a plurality of quartz reactor chambers 25. The reaction chambers 25 are joined by a junction 25a through which is introduced the process gases and from which the used gases are exhausted.

Positioned over each reaction chamber is a heater block 24, used to heat the reaction chamber to a desired temperature. Water to cool the lamp housing is introduced through the junctions 25a though inlet 26.

Each junction 25a has at least one exhaust tube 27 for removing exhaust gases from the reaction chambers. The exhaust gases are directed through a burn-off tube 31 to the gas burner 30.

The entire reactor is shrouded in an enclosure 37, and an air duct 29 is provided to circulate and exhaust gas-/air from inside the system shroud.

Figure 2:
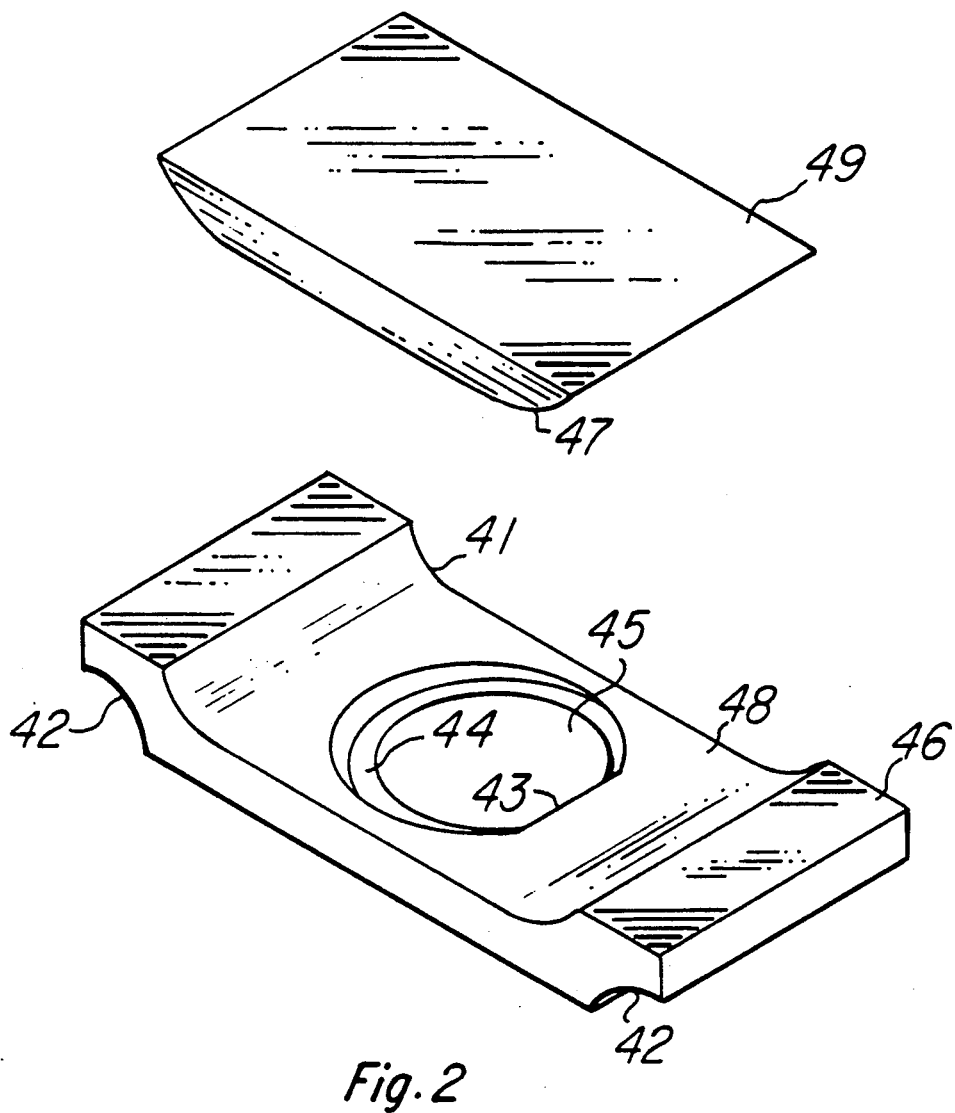
FIG. 2 illustrates a top loading semiconductor carrier of the present invention.

FIG. 2 illustrates a semiconductor carrier and lid of the present invention. Semiconductor carrier 40 has an opening 45 therein into which is place a semiconductor wafer. The wafer has one flat edge which is used to index or orientate the wafer. Opening 45 also has a flat side 43 to match the flat edge of the semiconductor wafer. It is necessary to orientate the wafer such that the flat of the semiconductor wafer matches the flat of the carrier wafer opening.

Semiconductor support area 44 protrudes from the sides of the bottom of opening 45 to hold the semiconductor in the opening and to expose a maximum of the under side of the wafer, which is the process side of the wafer.

Optionally small tabs may extend from the bottom side of opening 45 to support the semiconductor wafer.

The top of carrier 40 has an upper surface 46 and a lower surface 48. The lower surface 48 covers the most of the top surface of carrier 40 and is formed by machining out a portion of the carrier surface to form an opening for lid 46. There is a sloping transition from top surface 46 to lower surface 48 to match the shape of lid 46. Each end of the carrier has a rounded recess 42 which serves as guides to move the carrier along tracks in the reactor (not illustrated).

Lid 46 is used to cover the "up", or back, side of the wafer during processing, and to distribute heat to the semiconductor wafer during processing. The sloping end 47 of the lid matches the sloping transition 41 of the carrier.

Figure 3:
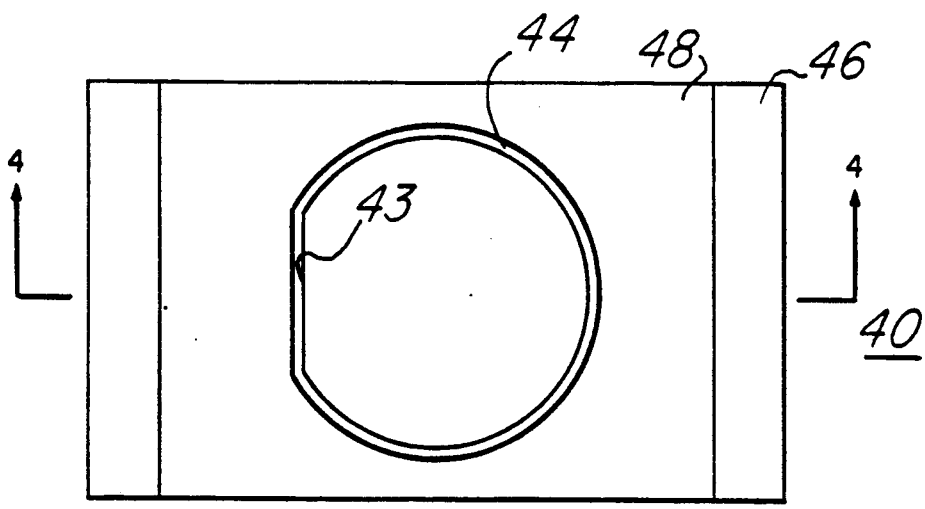
FIG. 3 is a top view of the semiconductor carrier.

FIG. 3 is a top view of carrier 40 showing the top surface 46 and the lower surface 48. The semiconductor support area 44 is recessed in the lower surface area to a depth equal to the thickness of the semiconductor wafer. The flat edge of the semiconductor wafer is positioned in the flat support area 43. The flat has been shown in a particular position, but may be constructed in any desired position in the semiconductor wafer opening.

Figure 4:
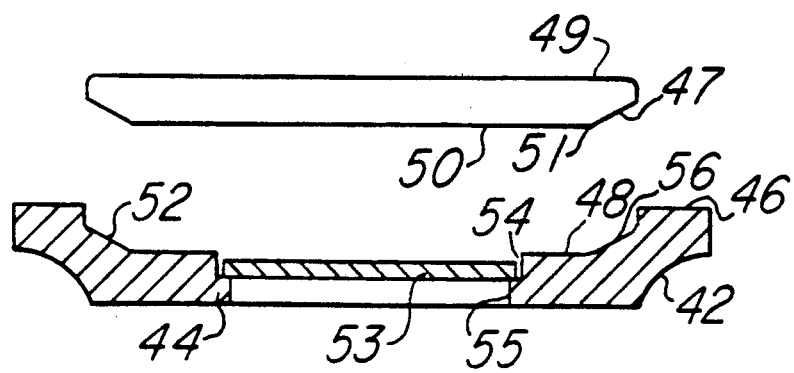
FIG. 4 is a side view of the semiconductor carrier and the lid in a raised position.

FIG. 4 is a side view of the semiconductor carrier 40 with the lid 49 positioned above it. In FIG. 4, a semiconductor wafer 53 is shown positioned on the support area 44.

The lower side (process side) of the semiconductor wafer is exposed through opening 55, allowing the process gases to contact the semiconductor wafer. The depth of the opening 54 into which the semiconductor wafer is placed is greater than the thickness as the semiconductor wafer so that when the lid 49 is placed on the carrier, the lid 49 does not contact the semiconductor and will provide uniform radiant heating from the lid to the semiconductor wafer. Lid 49 rests on surface 48 of the carrier.

Lid 49 has sloping ends 47 to mate with the sloping surface 56 which forms the transition between the upper surface 46 and the lower surface 48 of the carrier. Also, the bottom 50 of the lid is rounded at 51 to form a rounded transition between bottom 50 and sloping side 47.

The rounding of the lid opening at the carrier lower surface 48, particularly at 52 is important because square corners tend to cause stress in the carriers and lids due to heating and the resulting expansions of the parts. The large radius at 52 and 51 removes the stresses caused when the carrier and lid are heated to a high temperature during the processing of the semiconductor wafer.

What is claimed is:

1. A semiconductor wafer carrier for use in a continuous chemical vapor deposition reactor, comprising:
   a generally rectangular body of a high temperature material having first and second major faces, said first major face having a recess formed in and extending across said first major face,
   said body defining a generally circular opening extending from a lower surface defining, in part, said recess through the carrier and opening through the second of said major faces of the carrier,
   a lip extending from sides defining the generally circular opening for holding a semiconductor wafer,
   a lip shaped to fit in the recess formed in and extending across said first major face to cover a semiconductor wafer residing in said generally circular opening; and
   generally circular grooves on two sides of the carrier on which the carrier is to be moved through the reactor.

2. The carrier according to claim 1, wherein the carrier is made of silicon carbide coated graphite.

3. The carrier according to claim 1, wherein the lip extending from the sides defining the generally circular opening extend from the sides of the opening adjacent said second major face.

4. The carrier according to claim 1, wherein the surfaces defining generally circular opening have a flat edge region to correspond with a flat edge on a semiconductor wafer.

5. A semiconductor wafer carrier for use in a continuous chemical vapor deposition reactor, comprising;
- a generally rectangular body of a high temperature material, said body having two major surfaces and defining,
- an opening through the carrier corresponding to the shape of a semiconductor wafer to be mounted in the carrier;
- means for mounting a semiconductor wafer having a flat orientation edge in said opening through said carrier;
- means for mounting a semiconductor wafer having a flat orientation edge in said opening through said carrier;
- a recess in one side of said carrier;
- a lip extending from sides defining the opening through the carrier for holding a semiconductor wafer;
- a lid having a shape corresponding to the recess in said carrier for covering and transmitting heat to said semiconductor wafer; and
- generally circular grooves on two sides of the carrier on which the carrier is to be moved through the reactor.

6. The carrier according to claim 5, wherein the carrier is made of graphite coated with silicon carbide.

7. The carrier according to claim 5, wherein the lip extending from the sides defining the generally circular opening extends from the sides of the opening adjacent said second major face.

8. The carrier according to claim 5, wherein surfaces defining the generally circular opening in the carriage have a flat edge region partially defining the opening.

9. The carrier according to claim 5, wherein the lid and carrier have matching tapers to facilitate lid alignment on the carrier.

10. The carrier according to claim 5, wherein the lid and carrier have rounded corners to prevent stress due to the heating of the lid and carrier during processing of the semiconductor device during processing.

11. A semiconductor wafer carrier, having an under side and an upper side, for use in a continuous chemical vapor deposition reactor, comprising:
- a generally rectangular body of a high temperature material having two major faces;
- an opening through the carrier corresponding to the shape of a semiconductor wafer to be mounted in the carrier;
- means for mounting a semiconductor wafer having a flat orientation edge in said opening through said carrier;
- a recess in the upper side of said carrier;
- a lip extending from sides defining the opening through the carrier for holding a semiconductor wafer;
- a lid having a shape corresponding to the recess in the upper side of said carrier for covering and transmitting heat to said semiconductor wafer, said lid and carrier having matching tapers to facilitate lid alignment on the carrier; and
- said carrier having generally circular grooves extend along two sides of said carrier.

12. The carrier according to claim 11, wherein surfaces defining the generally circular opening in the carriage have a flat edge region partially defining the opening.

13. The carrier according to claim 11, wherein the carrier and lid are made of graphite coated with silicon carbide.

14. The carrier according to claim 13, wherein the lip extending from the sides defining the opening through the carrier extends from the sides of the opening adjacent said second major face.

* * * * *